US 9,881,916 B2

(12) United States Patent
Naito et al.

(10) Patent No.: US 9,881,916 B2
(45) Date of Patent: Jan. 30, 2018

(54) SEMICONDUCTOR DEVICE

(71) Applicant: FUJI ELECTRIC CO., LTD., Kanagawa (JP)

(72) Inventors: Tatsuya Naito, Matsumoto (JP); Masahito Otsuki, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/335,460

(22) Filed: Oct. 27, 2016

(65) Prior Publication Data

US 2017/0047320 A1 Feb. 16, 2017

Related U.S. Application Data

(63) Continuation of application No. PCT/JP2015/077318, filed on Sep. 28, 2015.

(30) Foreign Application Priority Data

Oct. 24, 2014 (JP) .................................. 2014-217183

(51) Int. Cl.
*H01L 29/66* (2006.01)
*H01L 27/06* (2006.01)
(Continued)

(52) U.S. Cl.
CPC ........ *H01L 27/0635* (2013.01); *H01L 21/822* (2013.01); *H01L 21/8234* (2013.01); *H01L 27/04* (2013.01); *H01L 27/06* (2013.01); *H01L 27/088* (2013.01); *H01L 29/06* (2013.01); *H01L 29/0634* (2013.01); *H01L 29/4236* (2013.01); *H01L 29/7397* (2013.01);
(Continued)

(58) Field of Classification Search
CPC ............. H01L 27/0635; H01L 29/0634; H01L 29/4236; H01L 29/7397; H01L 29/7827; H01L 21/8234; H01L 29/78; H01L 27/04; H01L 27/06; H01L 27/088; H01L 21/822; H01L 29/06; H02H 3/08; H03K 17/08
USPC ......................................................... 257/140
See application file for complete search history.

(56) References Cited

U.S. PATENT DOCUMENTS 7,307,312 B2* 12/2007 Suzuki .................... H01L 21/78
257/328
2012/0235710 A1* 9/2012 Roessler .............. H03K 17/567
327/109

(Continued)

FOREIGN PATENT DOCUMENTS

| JP | H04-354156 A | 12/1992 |
| JP | 2006-344779 A | 12/2006 |
| JP | 2012-253202 A | 12/2012 |

OTHER PUBLICATIONS

International Search Report for International Application No. PCT/JP2015/077318 issued by the Japan Patent Office dated Dec. 22, 2015.

*Primary Examiner* — Vu A Vu

(57) ABSTRACT

To improve a tradeoff between ON voltage and ON/OFF loss while maintaining short-circuit tolerance, provided is a semiconductor device including an IGBT element; a super junction transistor element connected in parallel with the IGBT element; and a limiting section that limits a voltage applied to a gate terminal of the IGBT element more than a voltage applied to a gate terminal of the super junction transistor element.

9 Claims, 13 Drawing Sheets

(51) Int. Cl.
    *H01L 21/822*     (2006.01)
    *H01L 21/8234*     (2006.01)
    *H01L 29/78*     (2006.01)
    *H01L 27/04*     (2006.01)
    *H01L 27/088*     (2006.01)
    *H01L 29/06*     (2006.01)
    *H03K 17/08*     (2006.01)
    *H01L 29/423*     (2006.01)
    *H01L 29/739*     (2006.01)
    *H02H 3/08*     (2006.01)
    *H03K 17/12*     (2006.01)

(52) U.S. Cl.
    CPC .......... *H01L 29/78* (2013.01); *H01L 29/7827* (2013.01); *H02H 3/08* (2013.01); *H03K 17/08* (2013.01); *H03K 17/122* (2013.01); *H03K 17/127* (2013.01)

(56) References Cited

U.S. PATENT DOCUMENTS

2013/0155745 A1      6/2013    Tanaka et al.
2014/0184303 A1      7/2014    Hasegawa et al.

\* cited by examiner

SEMICONDUCTOR DEVICE

The contents of the following Japanese patent applications are incorporated herein by reference:
NO. 2014-217183 filed in JP on Oct. 24, 2014, and
NO. PCT/JP2015/077318 filed on Sep. 28, 2015.

BACKGROUND

1. Technical Field

The present invention relates to a semiconductor device.

2. Related Art

A conventional semiconductor device is known in which an IGBT (Insulated Gate Bipolar Transistor) and a field effect transistor such as a MOSFET are connected in parallel, as shown in Patent Document 1, for example.
Patent Document 1: Japanese Patent Application Publication No. 2014-130909 (US Patent Application Publication No. 2014/184303)

The short-circuit tolerance of a semiconductor device is determined by whichever of the short-circuit tolerance of the IGBT and the short-circuit tolerance of the FET is lower. When a short-circuit is detected, a relatively larger current flows through the IGBT than through the FET. Therefore, the short-circuit tolerance of the semiconductor device in which an IGBT and an FET are connected in parallel is determined by the short-circuit tolerance of the IGBT. In order to increase the short-circuit tolerance of the IGBT, the channel density of the IGBT may be reduced, but reducing the channel density increases the loss occurring when the IGBT is turned ON and OFF.

SUMMARY

According to a first aspect of the present invention, provided is a semiconductor device comprising an IGBT element, a super junction transistor element, and a limiting section. The super junction transistor element may be connected in parallel with the IGBT element. The limiting section may limit a gate voltage applied to a gate terminal of the IGBT element more than a gate voltage applied to a gate terminal of the super junction transistor element.

The semiconductor device may further comprise an external terminal that receives an external voltage from outside. The gate voltages applied to the IGBT element and the super junction transistor element may each based on the external voltage that is shared by the IGBT element and the super junction transistor element.

The limiting section may clamp a range of the gate voltage applied to the IGBT element to be narrower than a range of the gate voltage applied to the super junction transistor element. The limiting section may include a clamp diode connected between a gate and an emitter of the IGBT element.

The limiting section may cause the gate voltage applied to the IGBT element to be less than the gate voltage applied to the super junction transistor element. The limiting section may include a voltage drop diode that is connected in series with a gate terminal of the IGBT element.

A gate resistance of the IGBT element may be greater than a gate resistance of the super junction transistor element. A threshold voltage of the IGBT element may be higher than a threshold voltage of the super junction transistorelement. A gate resistance of the super junction transistor element may be greater than a gate resistance of the IGBT element. The threshold voltage of the super junction transistor element may be higher than the threshold voltage of the IGBT element. The IGBT element and the super junction transistor element may be formed on a same semiconductor substrate.

According to a second aspect of the present invention, provided is a semiconductor device comprising an IGBT element, a super junction transistor element connected in parallel with the IGBT element, and a resistor connected to a gate terminal of the IGBT element. A gate resistance of the IGBT element may be greater than a gate resistance of the super junction transistor element. The IGBT element and the super junction transistor element may be formed on a same semiconductor substrate.

According to a third aspect of the present invention, provided is a semiconductor device comprising an IGBT element, a super junction transistor element connected in parallel with the IGBT element, and a resistor connected to a gate terminal of the super junction transistor element. A gate resistance of the super junction transistor element may be greater than a gate resistance of the IGBT element. The IGBT element and the super junction transistor element may be formed on a same semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
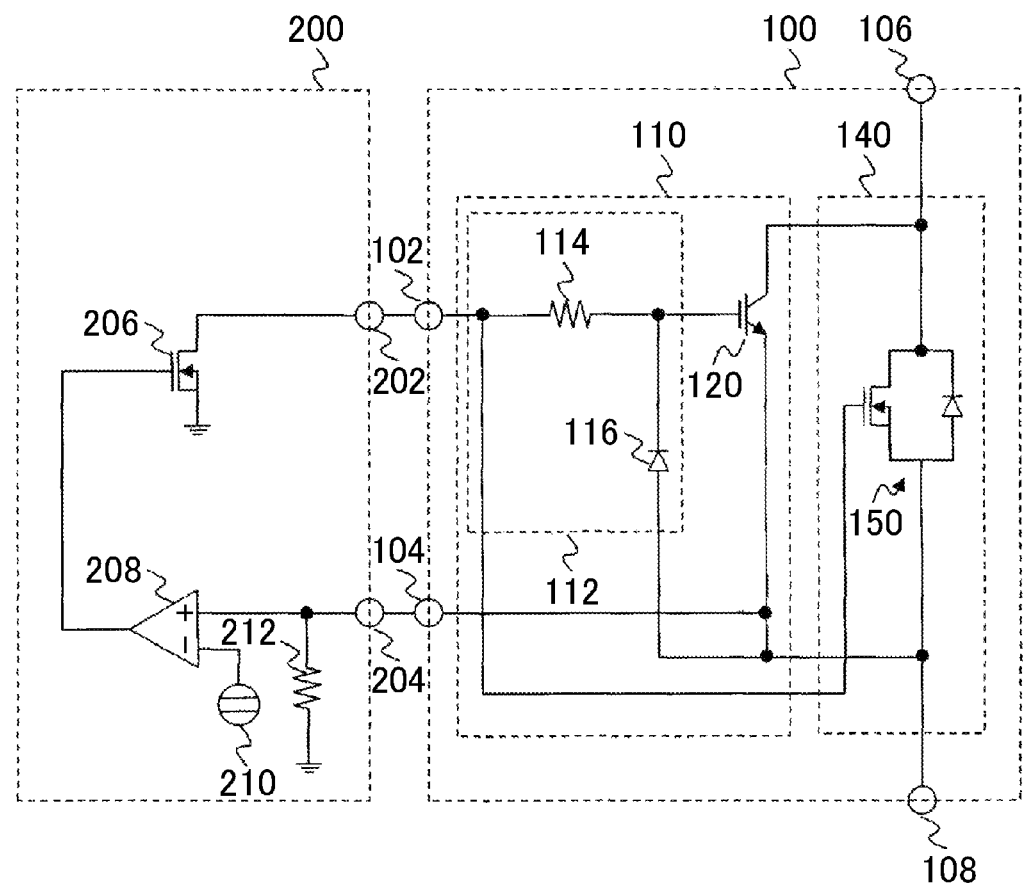
FIG. 1 shows an exemplary circuit configuration of a semiconductor device 100 and a protection circuit 200.

FIG. 1 shows an exemplary circuit configuration of a semiconductor device 100 and a protection circuit 200. The semiconductor device 100 limits the voltage applied to the gate terminal of an IGBT element 120 more than the voltage applied to the gate terminal of an SJMOS element 150, which is an example of a super junction transistor element. In this way, even when the channel density of the IGBT element 120 is increased, it is possible to maintain the short-circuit tolerance. Therefore, it is possible to improve the tradeoff between the ON voltage and the turn-OFF loss while also maintaining the short-circuit tolerance.

The semiconductor device 100 of this example includes an IGBT chip 110, an SJ (super junction) transistor chip 140, and external terminals 102, 104, 106, and 108. The external terminals 102 to 108 are terminals for electrically connecting the inside of the semiconductor device 100 to the outside.

The IGBT chip 110 includes an IGBT element 120 and a limiting section 112. The SJ transistor chip 140 includes an SJMOS element 150. The IGBT element 120 has a collector terminal that is connected to the external terminal 106 and an emitter terminal that is connected to the external terminal 108. The SJMOS element 150 is connected in parallel with the IGBT element 120. In other words, the SJMOS element 150 is connected between the external terminal 106 and the external terminal 108.

By connecting the IGBT element 120 and the SJMOS element 150 in parallel, it is possible to lower the ON voltage by utilizing the characteristics of the SJMOS element 150 in the low-current region. Therefore, it is possible to lower the steady loss. Furthermore, it is possible to realize a high withstand voltage by utilizing the characteristics of the IGBT element 120 in a high-current region.

The limiting section 112 limits the voltage applied to the gate terminal of the IGBT element 120 more than the voltage applied to the gate terminal of the SJMOS element 150. Here, limiting may mean that the upper limit value of the voltage applied to the gate terminal of the IGBT element 120 is caused to be lower than the upper limit value of the voltage applied to the gate terminal of the SJMOS element 150, or may mean that the voltage applied to the gate terminal of the IGBT element 120 is caused to be lower than the voltage applied to the gate terminal of the SJMOS element 150. The limiting section 112 of this example clamps the range of the gate voltage applied to the IGBT element 120 to be a narrower range than the range of the gate voltage applied to the SJMOS element.

The external terminal 102 receives an external voltage from an external power supply. This external voltage is 15 V, for example. Respective gate terminals of the IGBT element 120 and the SJMOS element 150 of this example are electrically connected to the external terminal 102, and gate voltages applied to the IGBT element and the super junction transistor element are each based on the common external voltage.

In this example, the gate voltage applied to the IGBT element 120 is limited by the limiting section 112. On the other hand, the gate voltage applied to the SJMOS element 150 is not limited by the limiting section 112. Instead, the limiting section 112 may limit both the gate voltage applied to the applied to the SJMOS element 150 and the gate voltage applied to the IGBT element 120. In such a case, the limiting section 112 limits the gate voltage applied to the IGBT element 120 to a greater degree than the gate voltage applied to the SJMOS element 150.

The limiting section 112 of this example includes a resistor 114 and a clamp diode 116. The clamp diode 116 is connected between the gate and emitter of the IGBT element 120. The cathode terminal of the clamp diode 116 is connected to the gate terminal of the IGBT element 120, and the anode terminal of the clamp diode 116 is connected to the emitter terminal of the IGBT element 120. The clamp diode 116 is a Zener diode, for example. When a voltage that is greater than or equal to a prescribed clamp voltage is applied between the gate and emitter of the IGBT element 120, the clamp diode 116 enables conduction between the gate and emitter. In this way, the voltage between the gate and emitter of the IGBT element 120 is clamped.

This clamp voltage is lower than the voltage applied to the external terminal 102 during normal operation. For example, the voltage applied to the external terminal 102 during normal operation is approximately 15 V, and the clamp voltage is approximately 13 V. In this way, during normal operation, a gate voltage of approximately 15 V is applied to the SJMOS element 150 and a gate voltage of approximately 13 V is applied to the IGBT element 120.

By limiting the gate voltage of the IGBT element 120, it is possible to improve the short-circuit tolerance of the IGBT element 120. Therefore, it is possible to maintain the short-circuit tolerance even when the channel density of the IGBT element 120 is increased in accordance with the amount by which the short-circuit tolerance is to be improved. Accordingly, it is possible to improve the tradeoff between the ON voltage and the turn-OFF loss, while maintaining the short-circuit tolerance. Also, the short-circuit tolerance may be improved while maintaining the channel density.

The resistor 114 is connected between the external terminal 102 and the gate terminal of the IGBT element 120. By providing the resistor 114, the gate resistance of the IGBT element 120 becomes greater than the gate resistance of the SJMOS element 150, and the threshold voltage of the IGBT element 120 becomes higher than the threshold voltage of the SJMOS element 150. In this Specification, the gate resistance refers to the combined resistance component of the resistance component of the gate electrode itself and the resistance component connected to the gate electrode. In this way, the SJMOS element 150 is turned ON earlier than the IGBT element 120 and is turned OFF later than the IGBT element 120. As a result, it is possible to reduce the turn-ON loss by turning ON the SJMOS element 150, which has a high ON resistance in a high-current region, earlier.

The protection circuit 200 includes a transistor 206, a comparator 208, a reference voltage source 210, a resistor 212, a connection terminal 202, and a connection terminal 204. The connection terminal 202 is connected to the external terminal 102 of the semiconductor device 100. The connection terminal 204 is connected to the external terminal 104 of the semiconductor device 100. In addition to the protection circuit 200, a voltage supply that applies a gate voltage is connected to the external terminal 102.

One end of the resistor 212 is connected to the emitter terminal of the IGBT element 120, via the connection terminal 204 and the external terminal 104. The other end of the resistor 212 has a reference potential such as a ground potential applied thereto. A current corresponding to the emitter current of the IGBT element 120 flows through the resistor 212. The voltage between the two ends of the resistor 212 is determined according to this current.

The comparator 208 compares the potential at one end of the resistor 212 to a prescribed reference potential generated by the reference voltage source 210. The comparator 208 turns OFF the transistor 206 when the potential of the resistor 212 is higher than the reference potential. The transistor 206 is provided between the connection terminal 202 and the ground potential. When the transistor 206 is turned OFF, the gate terminal of the IGBT element 120 is connected to the ground potential and the IGBT element 120 is turned OFF. With this configuration, when an arm short-circuit occurs between the external terminals 106 and 108 of the semiconductor device 100, for example, it is possible to pull down the gate voltage of the IGBT element 120 and turn OFF the IGBT element 120.

Figure 2:
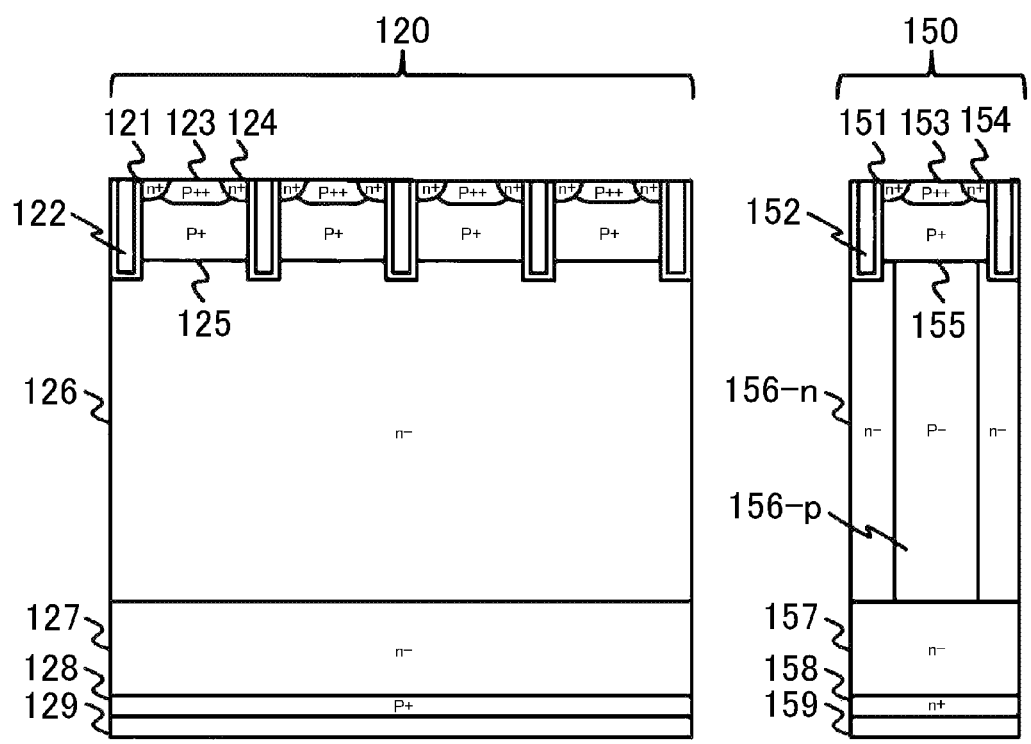
FIG. 2 shows an exemplary cross section of the IGBT element 120 and the SJMOS element 150.

FIG. 2 shows an exemplary cross section of the IGBT element 120 and the SJMOS element 150. The IGBT element 120 includes a p-type base layer 125 on the front surface side. The IGBT element 120 of this example includes a plurality of trench-type gate electrodes 122. A gate insulating film 121 is formed around each gate electrode 122. Each gate electrode 122 is formed in a manner to at least reach the end of the p-type base layer 125 on the back surface side.

Emitter regions 124 are formed in regions adjacent to the gate insulating film 121 on the front surface of the p-type base layer 125. Contact regions 123 are formed in regions sandwiched by the emitter regions 124 on the front surface of the p-type base layer 125. The IGBT element 120 includes front surface electrodes connected to the contact regions 123 and the emitter regions 124, an insulating film that insulates these front surface electrodes from the gate electrodes 122, and the like, but these components are not shown in FIG. 2.

The IGBT element 120 includes an n-type base layer 126 on the back surface side of the p-type base layer 125 and the gate insulating film 121. When a prescribed voltage is applied to the gate electrodes 122, a channel is formed in the p-type base layer 125 along the gate insulating film 121, and conduction occurs between the emitter regions 124 and the n-type base layer 126.

An FS (field stop) layer 127, a collector layer 128, and a back surface electrode 129 are formed sequentially on the back surface side of the n-type base layer 126. In this way, the IGBT element 120 is formed.

The SJMOS element 150 includes a p-type base layer 155 on the front surface side. The SJMOS element 150 of this example includes a plurality of trench-type gate electrodes 152. A gate insulating film 151 is formed around each gate electrode 152. Each gate electrode 152 is formed in a manner to reach at least the end of the p-type base layer 155 on the back surface side.

Source regions 154 are formed in a region adjacent to the gate insulating film 151 on the front surface of the p-type base layer 155. A contact region 153 is formed in the region sandwiched by the source regions 154 on the front surface of the p-type base layer 155. The SJMOS element 150 includes a front surface electrode connected to the contact region 153 and the source regions 154, an insulating film that insulates this front surface electrode from the gate electrode 152, and the like, but these components are not shown in FIG. 2.

The SJMOS element 150 includes n-type columns 156-$n$ and a p-type column 156-$p$ on the back surface side of the p-type base layer 155 and the gate insulating film 151. The n-type columns 156-$n$ and the p-type column 156-$p$ are arranged in an alternating manner in a direction parallel to the front surface of the SJMOS element 150. In this example, the n-type columns 156-$n$ are provided on the back surface side of the gate insulating film 151 and the p-type column 156-$p$ is formed on the back surface side of the p-type base layer 155. The ends of the n-type columns 156-$n$ on the front surface side also contact the p-type base layer 155.

An FS layer 157, a drain layer 158, and a back surface electrode 159 are formed sequentially on the back surface side of the n-type columns 156-$n$ and the p-type column 156-$p$. In this way, the SJMOS element 150 is formed.

Figure 3:
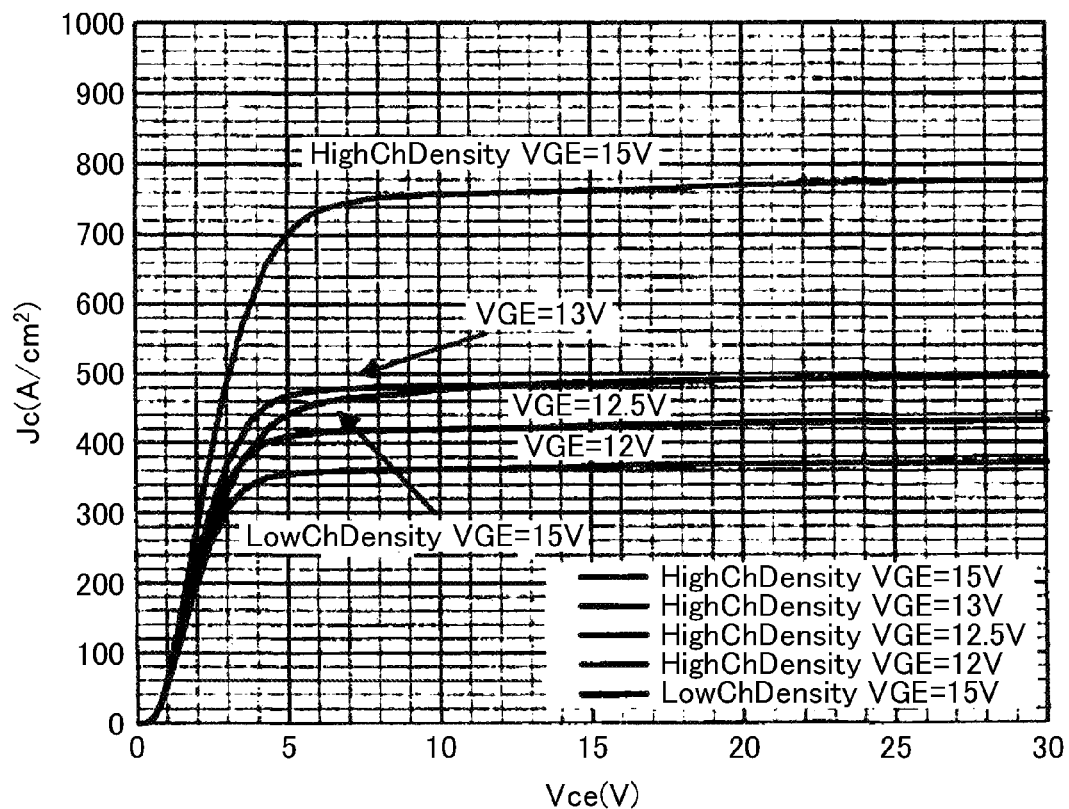
FIG. 3 shows an example of a Vce-Jc characteristic of the IGBT element.

FIG. 3 shows an example of a Vce-Jc characteristic of the IGBT element. Here, Vce indicates the collector-emitter voltage and Jc indicates the collector-emitter current density. FIG. 3 shows cases where the gate-emitter voltage VGE in an IGBT element having a high channel density is set to 15 V, 13 V, 12.5 V, and 12 V and where the gate-emitter voltage VGE in an IGBT element having a low channel density is set to 15 V.

As an example, it is possible to realize approximately the same saturation current density in a case where the gate-emitter voltage VGE in the IGBT element having a high channel density is set to 13 V and in a case where the gate-emitter voltage VGE in the IGBT element having a low channel density is set to 15 V. In other words, even when the channel density is high, it is possible to prevent an increase in the saturation current density and to maintain the short-circuit tolerance by clamping the gate voltage. Since the channel density is increased, it is possible to reduce the turn-OFF loss.

A power supply of 15 V, for example, is used as the external power supply of the semiconductor device 100. The limiting section 112 limits the gate voltage of the IGBT element 120 such that the saturation current density thereof becomes approximately 60%, for example, of the saturation current density of the IGBT element 120 occurring in a case where the application voltage of the external power supply is applied as the gate voltage. The channel density of the IGBT element 120 may be increased by an amount corresponding to the degree to which the saturation current density is reduced by limiting the gate voltage. The limiting section 112 may limit the gate voltage such that the saturation current density of the IGBT element 120 in a case where the gate voltage is limited is approximately in a range from 40% to 80%, more preferably approximately in a range from 50% to 70%, of the saturation current density of the IGBT element 120 in a case where the gate voltage is not limited.

Figure 4:
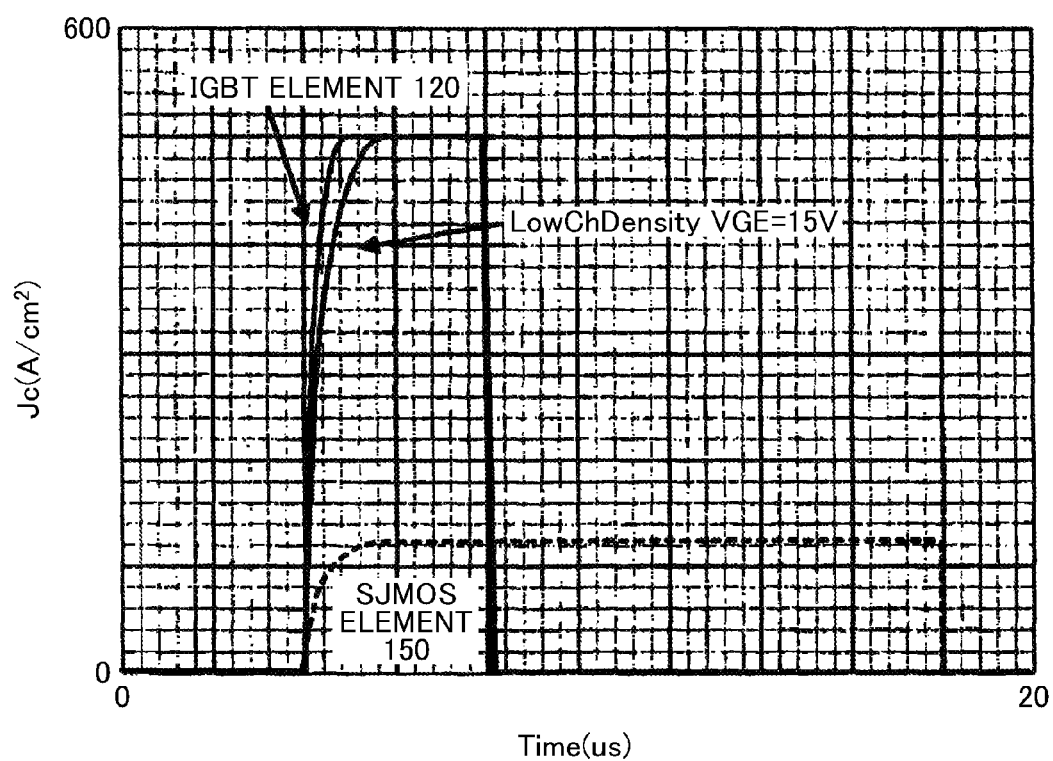
FIG. 4 shows an exemplary short-circuit tolerance of the IGBT element 120 and the SJMOS element 150.

FIG. 4 shows an exemplary short-circuit tolerance of the IGBT element 120 and the SJMOS element 150. Furthermore, an exemplary IGBT element with a low channel density and a gate voltage set to 15 V is shown together with this IGBT element 120 and SJMOS element 150, as a comparative example. The IGBT element 120 of this example clamps the gate voltage at 13 V, such that the channel density is higher than that of the IGBT element of the comparative example. Furthermore, the SJMOS element 150 has a gate voltage of 15 V.

As shown in FIG. 4, the short-circuit tolerance of the IGBT element 120 is equivalent to that of the comparative example that has a low channel density. The short-circuit tolerance corresponds to the length of time from when a current begins flowing until when the current is cut off in FIG. 4.

Figure 5:
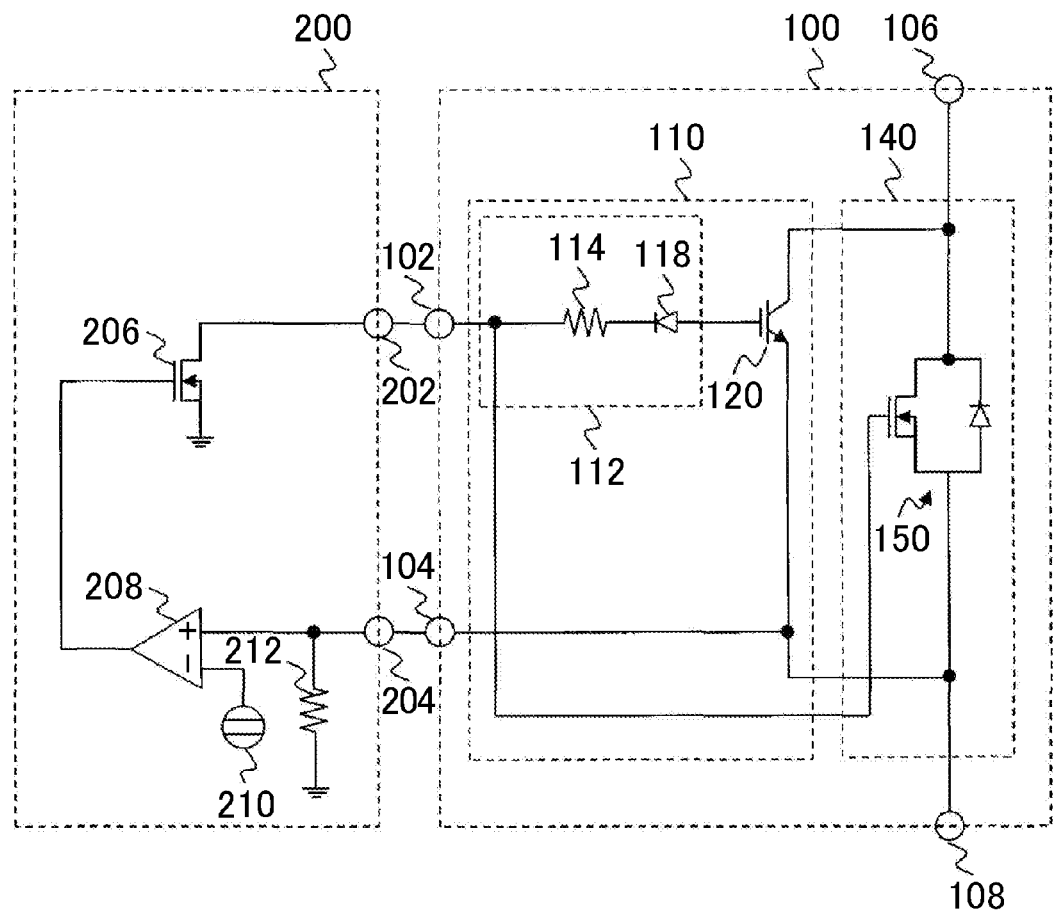
FIG. 5 shows another exemplary configuration of the semiconductor device 100.

FIG. 5 shows another exemplary configuration of the semiconductor device 100. The semiconductor device 100 of this example differs from the semiconductor device 100 shown in FIG. 1 with regard to the configuration for the limiting section 112. The remaining configuration of this semiconductor device 100 is the same as that of the semiconductor device 100 shown in FIG. 1. The limiting section 112 of this example causes the gate voltage applied to the IGBT element 120 to be less than the gate voltage applied to the SJMOS element 150. The limiting section 112 of this example includes a voltage drop diode 118 instead of the clamp diode 116.

The voltage drop diode 118 is connected in series with the gate terminal of the IGBT element 120. In this example, the voltage drop diode 118 is provided between the resistor 114 and the gate terminal of the IGBT element 120. The voltage drop diode 118 reduces the gate voltage by approximately 2 V, for example. With this configuration as well, the gate voltage of the IGBT element 120 can be made lower than the gate voltage of the SJMOS element 150. Accordingly, it is possible to reduce the turn-OFF loss by increasing the channel density, while maintaining the short-circuit tolerance of the IGBT element 120.

Figure 6:
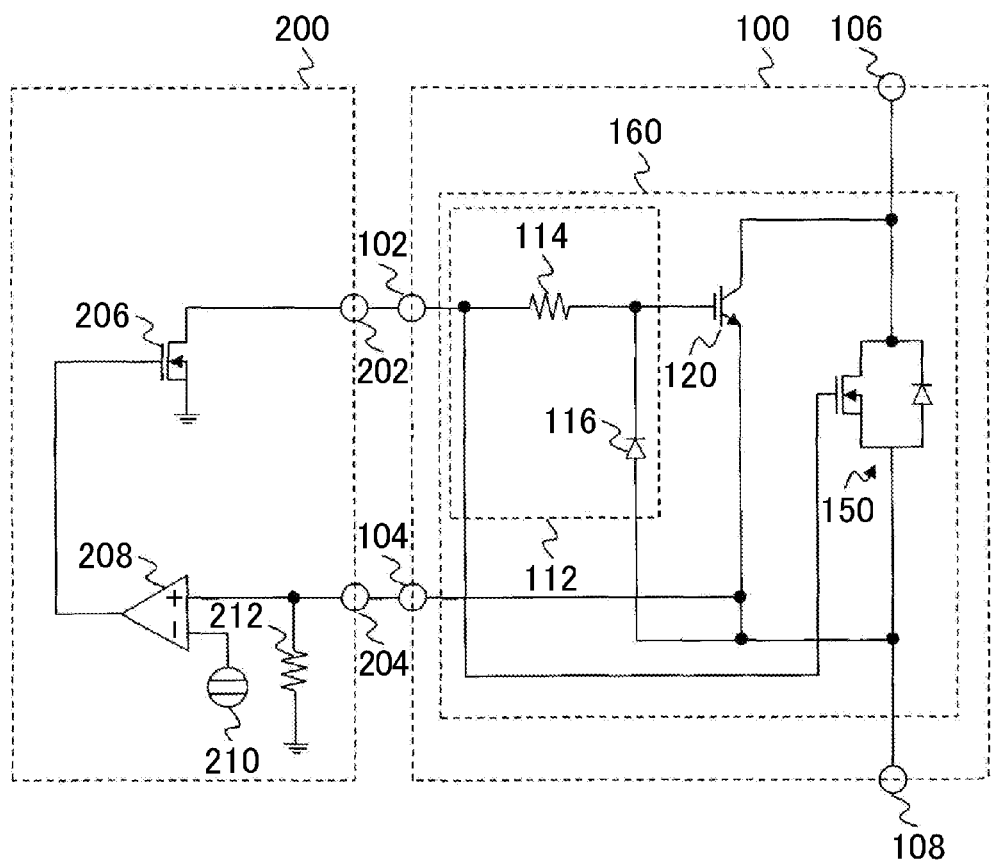
FIG. 6 shows another exemplary configuration of the semiconductor device 100.

FIG. 6 shows another exemplary configuration of the semiconductor device 100. The semiconductor device 100 of this example differs from the semiconductor device 100 shown in FIG. 1 in that the IGBT element 120 and the SJMOS element 150 are formed on the same semiconductor substrate 160. The clamp diode 116 may also be formed on the semiconductor substrate 160. Furthermore, the resistor 114 may also be formed on the semiconductor substrate 160. The remaining configuration of this semiconductor device 100 is the same as that of the semiconductor device 100 shown in FIG. 1. With this configuration, the semiconductor device 100 can be miniaturized.

Figure 7:
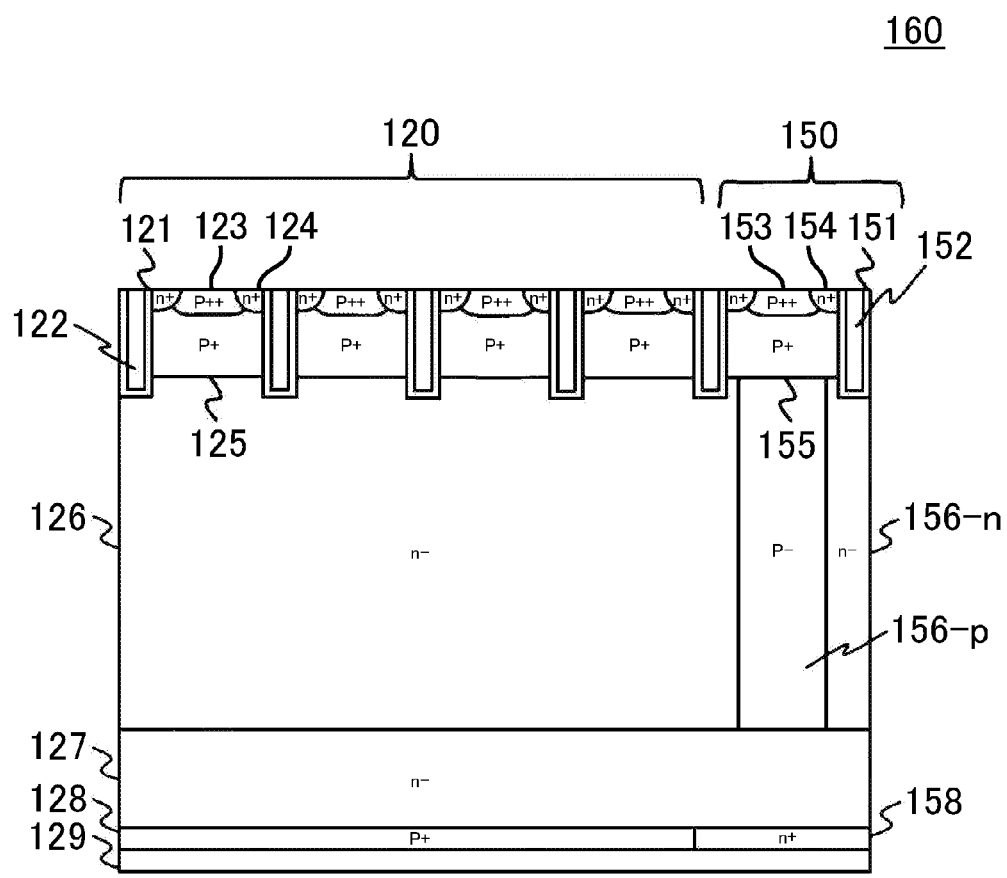
FIG. 7 shows an exemplary cross section of the IGBT element 120 and the SJMOS element 150 formed on the same semiconductor substrate.

FIG. 7 shows an exemplary cross section of the IGBT element 120 and the SJMOS element 150 formed on the same semiconductor substrate. The SJMOS element 150 of this example is formed adjacent to the IGBT element 120. In this example, the FS layer 127 also functions as an FS layer of the SJMOS element 150. Furthermore, the back surface electrode 129 also functions as a back surface electrode of the SJMOS element 150. The remaining configuration of this IGBT element 120 and SJMOS element 150 is the same as that of the IGBT element 120 and SJMOS element 150 shown in FIG. 2.

Figure 8:
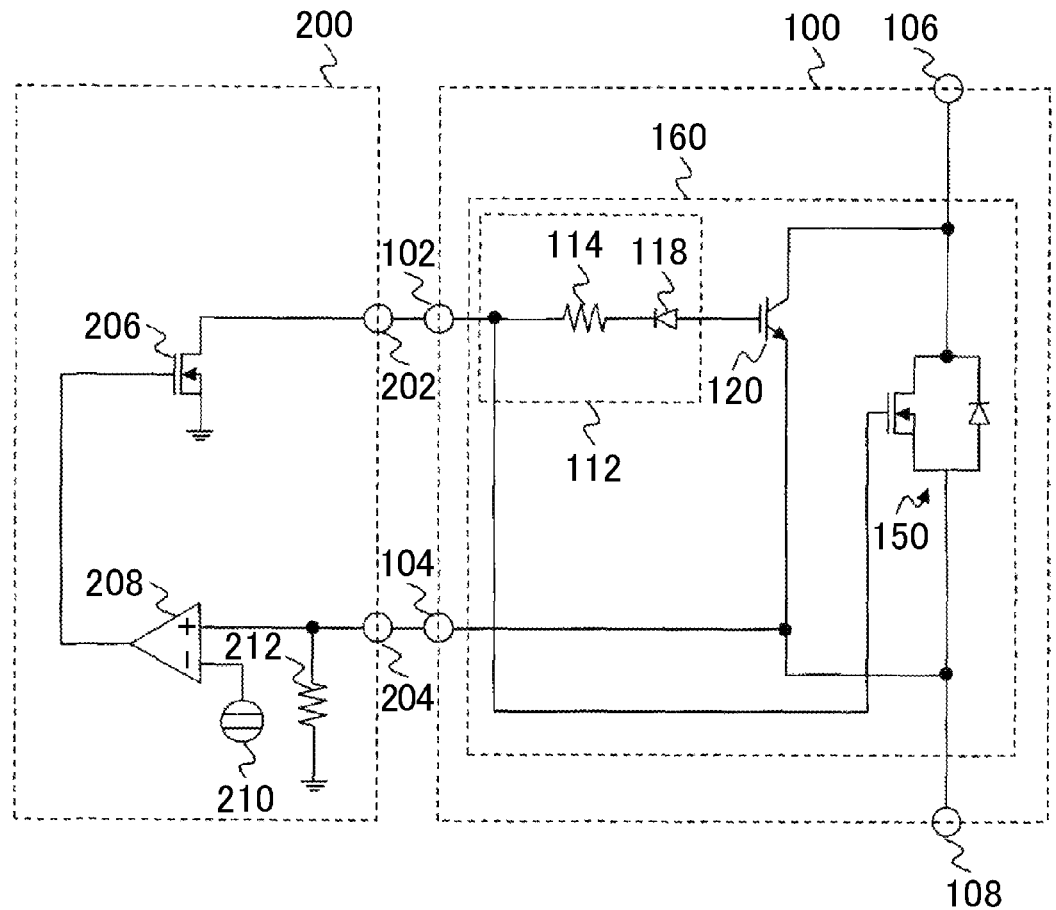
FIG. 8 shows another exemplary configuration of the semiconductor device 100.

FIG. 8 shows another exemplary configuration of the semiconductor device 100. The semiconductor device 100 of this example differs from the semiconductor device 100 shown in FIG. 5 in that the IGBT element 120 and the SJMOS element 150 are formed on the same semiconductor substrate 160. The voltage drop diode 118 may also be formed on the semiconductor substrate 160. Furthermore, the resistor 114 may also be formed on the semiconductor substrate 160. The remaining configuration of this semiconductor device 100 is the same as that of the semiconductor device 100 shown in FIG. 5. With this configuration, the semiconductor device 100 can be miniaturized.

Figure 9:
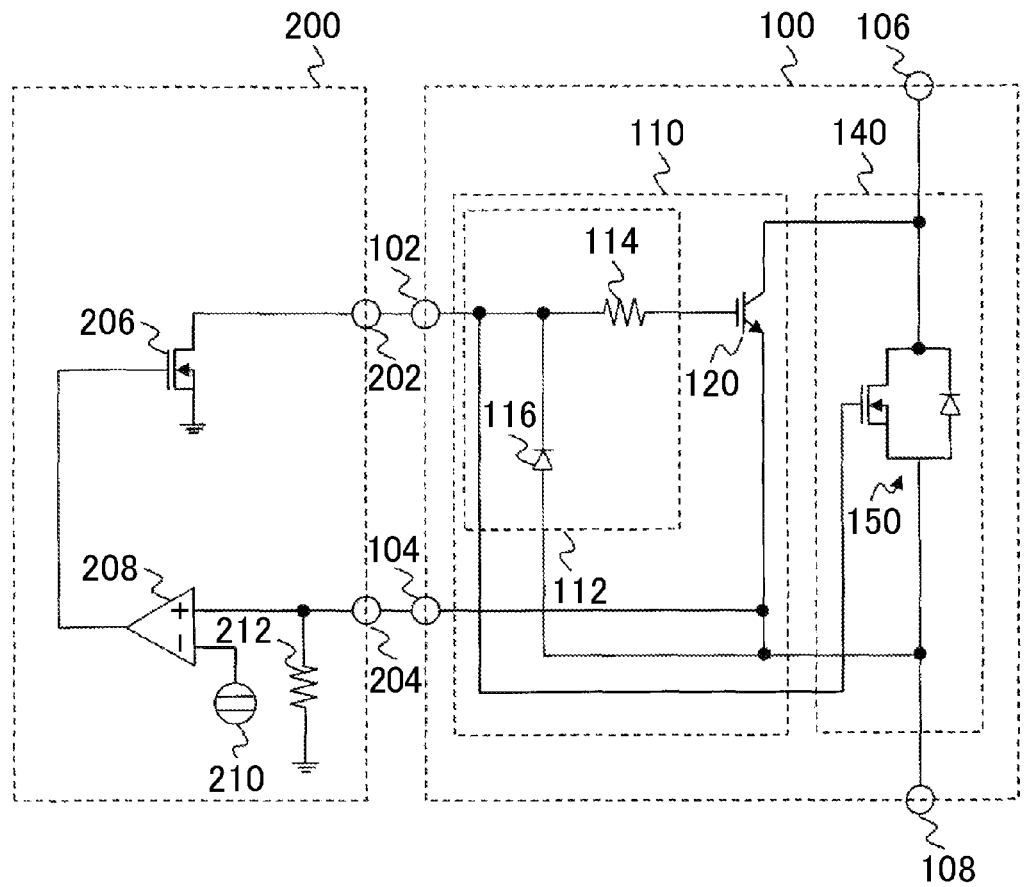
FIG. 9 shows another exemplary configuration of the semiconductor device 100.

FIG. 9 shows another exemplary configuration of the semiconductor device 100. The semiconductor device 100 of this example differs from the semiconductor devices 100 shown in FIGS. 1 and 6 with regard to the arrangement of the clamp diode 116. FIG. 9 shows an example in which the arrangement of the clamp diode 116 has been changed from the arrangement used in the semiconductor device 100 shown in FIG. 1. The clamp diode 116 of this example has a cathode terminal connected to the gate terminal of the IGBT element 120 via the resistor 114. With this configuration as well, it is possible to limit the gate voltage of the IGBT element 120.

Figure 10:
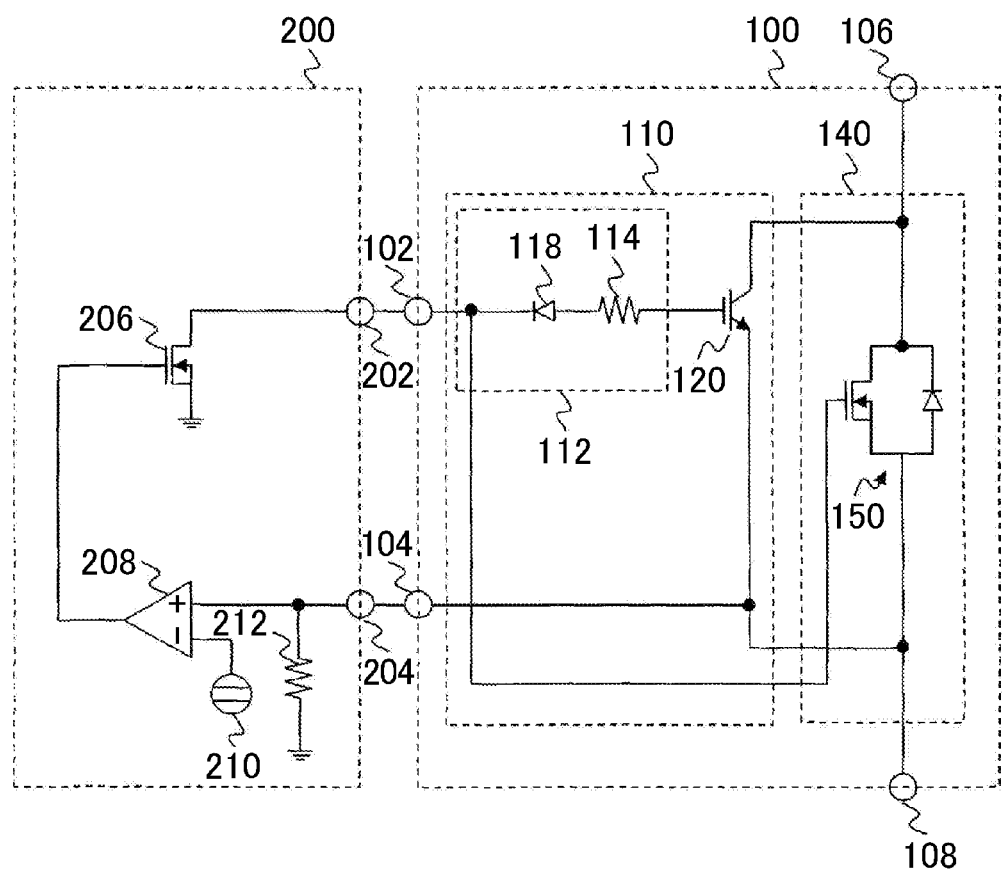
FIG. 10 shows another exemplary configuration of the semiconductor device 100.

FIG. 10 shows another exemplary configuration of the semiconductor device 100. The semiconductor device 100 of this example differs from the semiconductor devices 100 shown in FIGS. 5 and 8 with regard to the arrangement of the voltage drop diode 118. FIG. 10 shows an example in which the arrangement of the voltage drop diode 118 has been changed from the arrangement used in the semiconductor device 100 shown in FIG. 5. The voltage drop diode 118 of this example is connected between the external terminal 102 and the resistor 114. With this configuration as well, it is possible to limit the gate voltage of the IGBT element 120.

Figure 11:
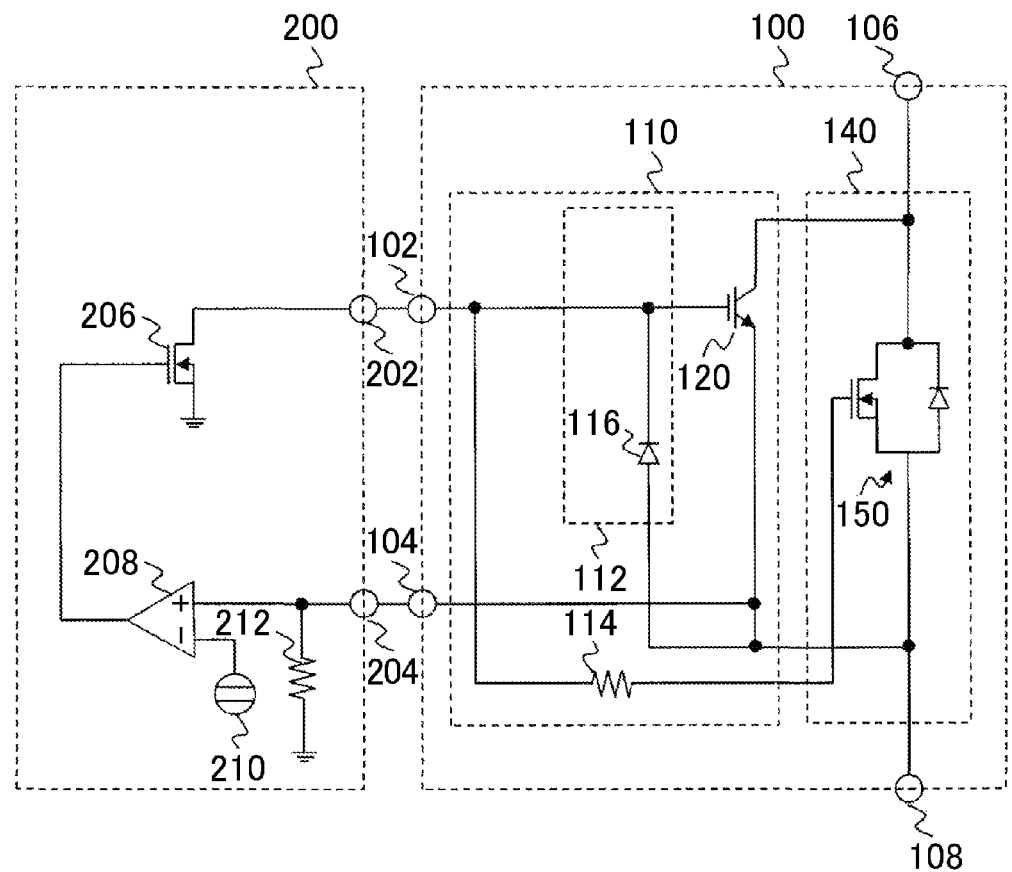
FIG. 11 shows another exemplary configuration of the semiconductor device 100.

FIG. 11 shows another exemplary configuration of the semiconductor device 100. The semiconductor device 100 of this example differs from the semiconductor devices 100 shown in FIGS. 1 to 10 with regard to the arrangement of the resistor 114. FIG. 11 shows an example in which the arrangement of the resistor 114 has been changed from the arrangement used in the semiconductor device 100 shown in FIG. 1. The resistor 114 of this example is connected between the gate terminal of the SJMOS element 150 and the external terminal 102.

By providing the resistor 114, the gate resistance of the SJMOS element 150 becomes greater than the gate resistance of the IGBT element 120, and the threshold voltage of the SJMOS element 150 becomes higher than the threshold voltage of the IGBT element 120. As a result, the SJMOS element 150 turns ON earlier than the IGBT element 120 and turns OFF later than the IGBT element 120. In this way, it is possible to restrict the current flowing through the SJMOS element 150, and therefore the SJMOS element 150 can be protected.

Figure 12:
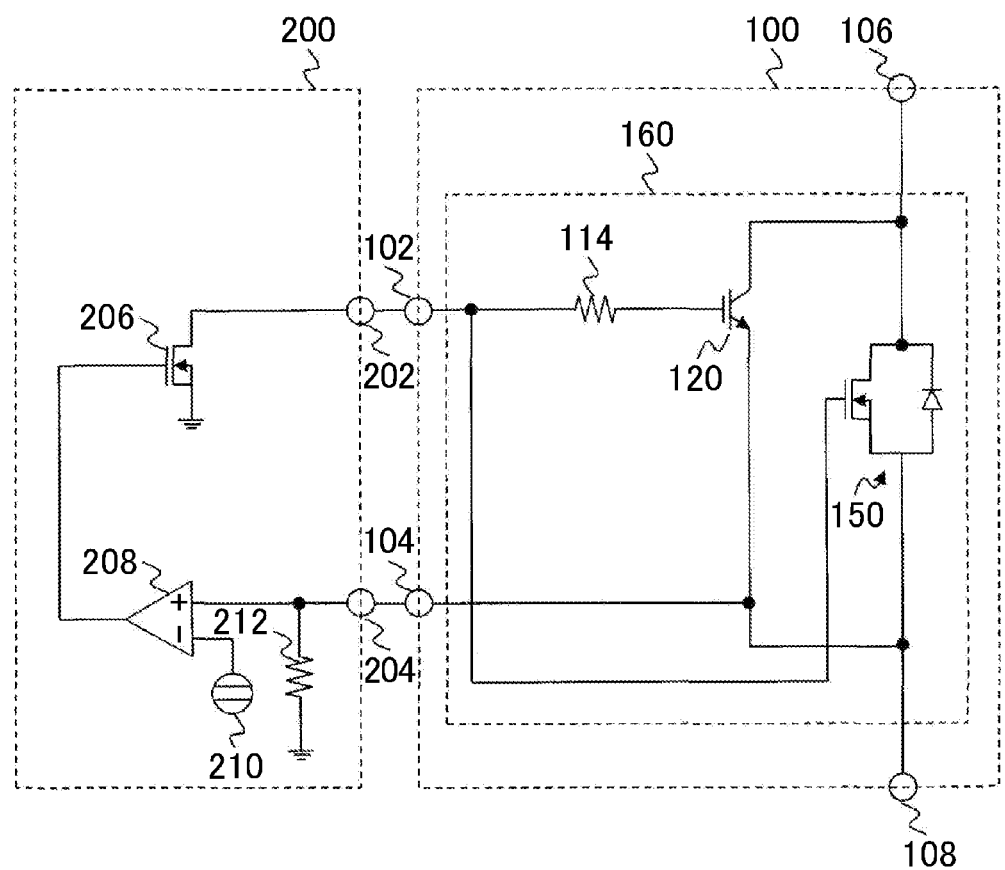
FIG. 12 shows another exemplary configuration of the semiconductor device 100.

FIG. 12 shows another exemplary configuration of the semiconductor device 100. The semiconductor device 100 of this example differs from the semiconductor device 100 shown in FIG. 6 by not including the limiting section 112 and the clamp diode 116. By connecting the resistor 114 to the gate terminal of the IGBT element 120, the gate resistance of the IGBT element 120 becomes greater than the gate resistance of the SJMOS element 150. Therefore, the IGBT element 120 can be turned ON earlier than the SJMOS element 150 and turned OFF later than the SJMOS element 150.

Furthermore, the gate resistance of the IGBT element 120 may be increased by controlling the material, film thickness, and the like of the gate electrode of the IGBT element 120. As long as the resistance value of the gate electrode itself of the IGBT element 120 can be made sufficiently greater than the gate resistance of the SJMOS element 150, there is no need to provide the resistor 114.

Figure 13:
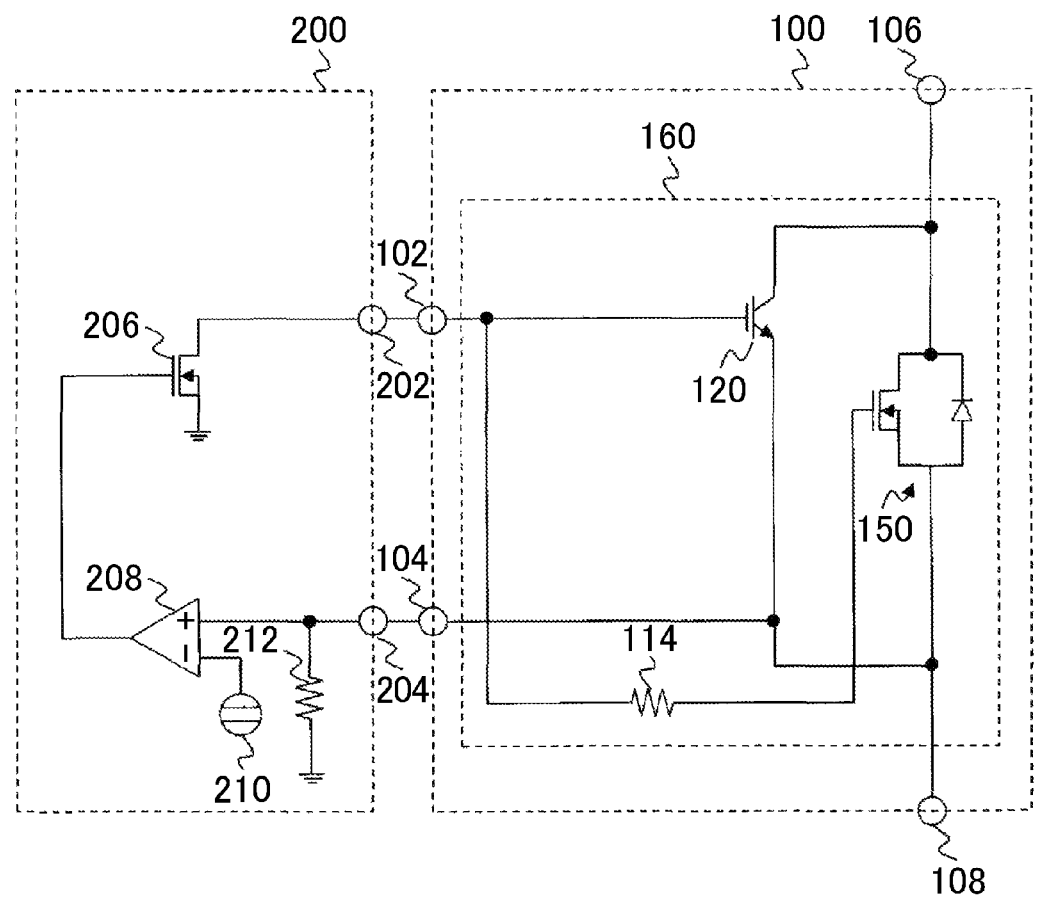
FIG. 13 shows another exemplary configuration of the semiconductor device 100.

FIG. 13 shows another exemplary configuration of the semiconductor device 100. The semiconductor device 100 of this example differs from the semiconductor device 100 shown in FIG. 8 by not including the limiting section 112 and the voltage drop diode 118. By connecting the resistor 114 to the gate terminal of the SJMOS element 150, the gate resistance of the SJMOS element 150 becomes greater than the gate resistance of the IGBT element 120. Therefore, the IGBT element 120 can be turned ON earlier than the SJMOS element 150 and turned OFF later than the SJMOS element 150.

Furthermore, the gate resistance of the SJMOS element 150 may be increased by controlling the material, film thickness, and the like of the gate electrode of the SJMOS element 150. As long as the resistance value of the gate electrode itself of the SJMOS element 150 can be made sufficiently greater than the gate resistance of the IGBT element 120, there is no need to provide the resistor 114.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

100: semiconductor device, 102, 104, 106, 108: external terminal, 110: IGBT chip, 112: limiting section, 114: resistor, 116: clamp diode, 118: voltage drop diode, 120: IGBT element, 121: gate insulating film, 122: gate electrode, 123: contact region, 124: emitter region, 125: p-type base layer, 126: n-type base layer, 127: FS layer, 128: collector layer, 129: back surface electrode, 140: SJ transistor chip, 150: SJMOS element, 151: gate insulating film, 152: gate electrode, 153: contact region, 154: source region, 155: p-type base layer, 156-$n$: n-type column, 156-$p$: p-type column, 157: FS layer, 158: drain layer, 159: back surface electrode, 160: semiconductor substrate, 200: protection circuit, 202, 204: connection terminal, 206: transistor, 208: comparator, 210: reference voltage source, 212: resistor

What is claimed is:

1. A semiconductor device comprising:
   an IGBT element;
   a super junction transistor element connected in parallel with the IGBT element; and
   a limiting section that limits a gate voltage applied to a gate terminal of the IGBT element more than a gate voltage applied to a gate terminal of the super junction transistor element, wherein
   the limiting section includes a first connection to the gate terminal of the IGBT element, and a second connection to the gate terminal of the super junction transistor element,
   the gate terminal of the IGBT element and the gate terminal of the super junction transistor element are electrically connected to a common external terminal through the limiting section, and
   gate voltages applied to the IGBT element and the super junction transistor element are supplied by a voltage supply connected to the common external terminal.

2. The semiconductor device according to claim 1, wherein
   the limiting section clamps a range of the gate voltage applied to the IGBT element to be narrower than a range of the gate voltage applied to the super junction transistor element.

3. The semiconductor device according to claim 2, wherein
   the limiting section includes a clamp diode connected between the gate terminal and an emitter terminal of the IGBT element.

4. The semiconductor device according to claim 1, wherein
   the limiting section causes the gate voltage applied to the IGBT element to be less than the gate voltage applied to the super junction transistor element.

5. The semiconductor device according to claim 4, wherein
   the limiting section includes a voltage drop diode that is connected in series with the gate terminal of the IGBT element.

6. The semiconductor device according to claim 1, wherein
   the IGBT element and the super junction transistor element are formed on a same semiconductor substrate.

7. The semiconductor device according to claim 1, wherein the limiting section includes a voltage drop diode between the first connection and the second connection.

8. A semiconductor device comprising:
   an IGBT element;
   a super junction transistor element connected in parallel with the IGBT element; and
   a limiting section that limits a gate voltage applied to a gate terminal of the IGBT element more than a gate voltage applied to a gate terminal of the super junction transistor element, wherein
   a gate resistance of the IGBT element is greater than a gate resistance of the super junction transistor element, and a threshold voltage of the IGBT element is higher than a threshold voltage of the super junction transistor element, and
   the limiting section causes the gate voltage applied to the IGBT element to be less than the gate voltage applied to the super junction transistor element.

9. A semiconductor device comprising:
   an IGBT element;
   a super junction transistor element connected in parallel with the IGBT element; and
   a limiting section that limits a gate voltage applied to a gate terminal of the IGBT element more than a gate voltage applied to a gate terminal of the super junction transistor element, wherein
   a gate resistance of the super junction transistor element is greater than a gate resistance of the IGBT element, and a threshold voltage of the super junction transistor element is higher than a threshold voltage of the IGBT element.

\* \* \* \* \*